(12) United States Patent
Iagodkine et al.

(10) Patent No.: US 9,330,809 B2
(45) Date of Patent: *May 3, 2016

(54) ELECTRICALLY CONDUCTING COMPOSITES, METHODS OF MANUFACTURE THEREOF AND ARTICLES COMPRISING THE SAME

(71) Applicants: Dow Global Technologies LLC, Midland, MI (US); Rohm and Haas Electronic Materials LLC, Marlborough, MA (US); The Penn State Research Foundation, University Park, PA (US)

(72) Inventors: Elissei Iagodkine, Marlborough, MA (US); George L. Athens, Freeland, MI (US); Enrique Daniel Gomez, State College, PA (US); Brandon Howard Smith, State College, PA (US)

(73) Assignees: DOW GLOBAL TECHNOLOGIES LLC, Midland, MI (US); ROHM AND HAAS ELECTRONIC MATERIALS LLC, Marlborough, MA (US); THE PENN STATE RESEARCH FOUNDATION, University Park, PA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/335,313

(22) Filed: Jul. 18, 2014

(65) Prior Publication Data

US 2015/0170784 A1 Jun. 18, 2015

Related U.S. Application Data

(63) Continuation-in-part of application No. 14/109,008, filed on Dec. 17, 2013.

(51) Int. Cl.
 *H01B 1/00* (2006.01)
 *H01L 51/00* (2006.01)

(Continued)

(52) U.S. Cl.
 CPC *H01B 1/127* (2013.01); *C08K 5/56* (2013.01); *H01L 31/00* (2013.01);

(Continued)

(58) Field of Classification Search
 CPC ........ H01B 1/00; H01B 1/127; C08F 4/65927
 See application file for complete search history.

(56) References Cited

U.S. PATENT DOCUMENTS

| | | | |
|---|---|---|---|
| 7,029,945 B2 | 4/2006 | Veres et al. | |
| 7,417,246 B2 | 8/2008 | Shin et al. | |

(Continued)

OTHER PUBLICATIONS

Smith et al "Controlling polymorphism in poly(3-hexylthiophene) through addition of ferrocene . . . ", Advanced Functional Materials (2015), 25, 542-551 (first pub Dec. 2014).*

(Continued)

*Primary Examiner* — Mark Kopec
(74) *Attorney, Agent, or Firm* — Cantor Colburn LLP

(57) ABSTRACT

Disclosed herein is a composition comprising a regioregular polyalkylthiophene and/or a regioregular poly[2,5-bis(3-alkylthiophen-2-yl)thieno(3,2-b)thiophene]; and a metallocene; where the metallocene is present in an amount of greater than 75 wt %, based on the total weight of the composition; where the charge mobility is increased by a factor of 3 or more over compositions having 50 wt % of ferrocene or less with the remainder being a regioregular polyalkylthiophene and/or a regioregular poly[2,5-bis(3-alkylthiophen-2-yl)thieno(3,2-b)thiophene]. Disclosed herein too is a method of manufacturing a thin film comprising dissolving a regioregular polyalkylthiophene and/or a regioregular poly [2,5-bis(3-alkylthiophen-2-yl)thieno(3,2-b)thiophene] in a solvent to form a solution; dissolving a metallocene in the solution; where the metallocene is present in an amount of 75 wt % or greater based on the total weight of the ferrocene and the regioregular polyalkylthiophene and/or the regioregular poly[2,5-bis(3-alkylthiophen-2-yl)thieno(3,2-b)thiophene]; disposing the solution on a substrate; and annealing the substrate.

11 Claims, 7 Drawing Sheets

(51) Int. Cl.
 H01B 1/12 (2006.01)
 H01L 31/00 (2006.01)
 C08K 5/56 (2006.01)
 H01L 51/05 (2006.01)

(52) U.S. Cl.
 CPC ....... *H01L 51/0037* (2013.01); *H01L 51/0083* (2013.01); *H01L 51/0566* (2013.01); *C08G 2261/1412* (2013.01); *C08G 2261/212* (2013.01); *C08G 2261/3223* (2013.01); *C08G 2261/51* (2013.01); *C08G 2261/512* (2013.01); *C08G 2261/92* (2013.01)

(56) References Cited

U.S. PATENT DOCUMENTS

| 8,859,718 | B2* | 10/2014 | Sheina et al. | 528/380 |
| 2006/0113527 | A1 | 6/2006 | Han | |
| 2008/0275212 | A1* | 11/2008 | Heeney et al. | 528/378 |
| 2009/0001359 | A1 | 1/2009 | Worle et al. | |
| 2010/0084614 | A1* | 4/2010 | Hoffart et al. | 252/500 |
| 2012/0193618 | A1 | 8/2012 | Takeya | |
| 2013/0074920 | A1 | 3/2013 | Echegoyen | |

OTHER PUBLICATIONS

Morten Bjerring et al. "Polythiophene by Solution Processing" Macromolecules 2007, 40, 6012-6013.

Frommer, Jane E., "Conducting Polymer Solutions" Acc. of Chem. Res., vol. 19, pp. 2-9, 1986.

Jarrett et al., "Field Effect Measurements in Doped Conjugated Polymer Films: Assessment of Charge Carrier Mobilities" Journal of Applied Physics 1995, 77, 6289-6294.

Brinkmann "Structure and Morphology Control in Thin Films of Regioregular Poly(3-hexylthiophene)" Journal of Polymer Science Part B: Polymer Physics 2011, 49, 1218-1233.

* cited by examiner

ELECTRICALLY CONDUCTING COMPOSITES, METHODS OF MANUFACTURE THEREOF AND ARTICLES COMPRISING THE SAME

CROSS-REFERENCE TO RELATED APPLICATIONS

This application is a continuation-in-part of and claims priority to U.S. patent application Ser. No. 14/109,008, filed on Dec. 17, 2013, the entire contents of which are hereby incorporated by reference.

BACKGROUND

This disclosure is related to highly crystalline electrically conducting composites, methods of manufacture thereof and to articles comprising the same.

Electrically conducting organic polymers and semiconducting organic polymers are often used in electronic devices that contain displays (e.g., computers, television sets, and the like), as well as in solar cells, and the like. They are employed in these devices in the form of thin film transistors that have flexible and non-flexible substrates. The combination of easy fabrication using methods such as ink-jet printing and roll-to-roll printing, the mechanical flexibility and modest charge mobilities of solution-processable conducting and semiconducting polymers has the potential to transform the electronics industry. One challenge to the application of polymers in digital electronics is the inherent complexity of the electrical properties of polymer films due to the semi-crystalline nature of many conjugated polymers.

Electron mobility within semiconducting conjugated polymers is dependent upon intrachain and interchain charge carrier hopping events. For example, charge carriers can hop between different chains due to the presence of intermolecular overlapping electron densities, such as π-π stacking. Consequently, the charge carrier mobility can depend on various aspects of the thin-film structure, such as the crystallinity, orientation of the crystals, electron cloud overlap in the unit cell, and the connectivity between ordered regions of the polymer.

U.S. Patent Application 2009/0001359 to Worle is directed to enhanced stability with the addition of metallocenes to polythiophene (PT). However, unsubstituted polythiophene is universally accepted as "insoluble and intractable." The standard polythiophene deposition approach requires an electrochemical process in which thiophene or bithiophene monomers are polymerized oxidatively at the anode. Research towards solution processing with polythiophene has resorted to extreme techniques, such as an $AsF_3/AsF_5$ solvent system or high temperature thermal cleaving of a soluble polythiophene derivate, but the resultant films cannot be re-dissolved following deposition.

It is therefore desirable to have electrically conducting polymeric compositions that display high charge mobility and that are easily processable.

SUMMARY

Disclosed herein is a composition comprising a regioregular polyalkylthiophene and/or a regioregular poly[2,5-bis(3-alkylthiophen-2-yl)thieno(3,2-b)thiophene]; and a metallocene; where the metallocene is present in an amount of greater than 50 wt %, based on the total weight of the composition.

Disclosed herein too is a method of manufacturing a thin film comprising dissolving a regioregular polyalkylthiophene or a regioregular poly[2,5-bis(3-alkylthiophen-2-yl)thieno(3,2-b)thiophene] in a solvent to form a solution; dissolving a metallocene in the solution; disposing the solution on a substrate; and annealing the substrate.

Disclosed herein is a composition comprising a regioregular polyalkylthiophene and/or a regioregular poly[2,5-bis(3-alkylthiophen-2-yl)thieno(3,2-b)thiophene]; and a metallocene; where the metallocene is present in an amount of greater than 75 wt %, based on the total weight of the composition; where the charge mobility is increased by a factor of 3 or more over compositions having 50 wt % of ferrocene or less with the remainder being a regioregular polyalkylthiophene and/or a regioregular poly[2,5-bis(3-alkylthiophen-2-yl)thieno(3,2-b)thiophene].

Disclosed herein too is a method of manufacturing a thin film comprising dissolving a regioregular polyalkylthiophene and/or a regioregular poly[2,5-bis(3-alkylthiophen-2-yl)thieno(3,2-b)thiophene] in a solvent to form a solution; dissolving a metallocene in the solution; where the metallocene is present in an amount of 75 wt % or greater based on the total weight of the ferrocene and the regioregular polyalkylthiophene and/or the regioregular poly[2,5-bis(3-alkylthiophen-2-yl)thieno(3,2-b)thiophene]; disposing the solution on a substrate; and annealing the substrate.

BRIEF DESCRIPTION OF THE FIGURES

FIG. 1 (b) is a graph showing transfer characteristics for representative organic thin film transistors prepared from neat poly(3-hexylthiophene) and 9:1 ferrocene and poly(3-hexylthiophene) solutions by weight;

FIG. 1 (c) is a graph showing hole mobility for representative organic thin film transistors prepared from neat poly(3-hexylthiophene) and 9:1 ferrocene and poly(3-hexylthiophene) solutions by weight;

Figure 1:
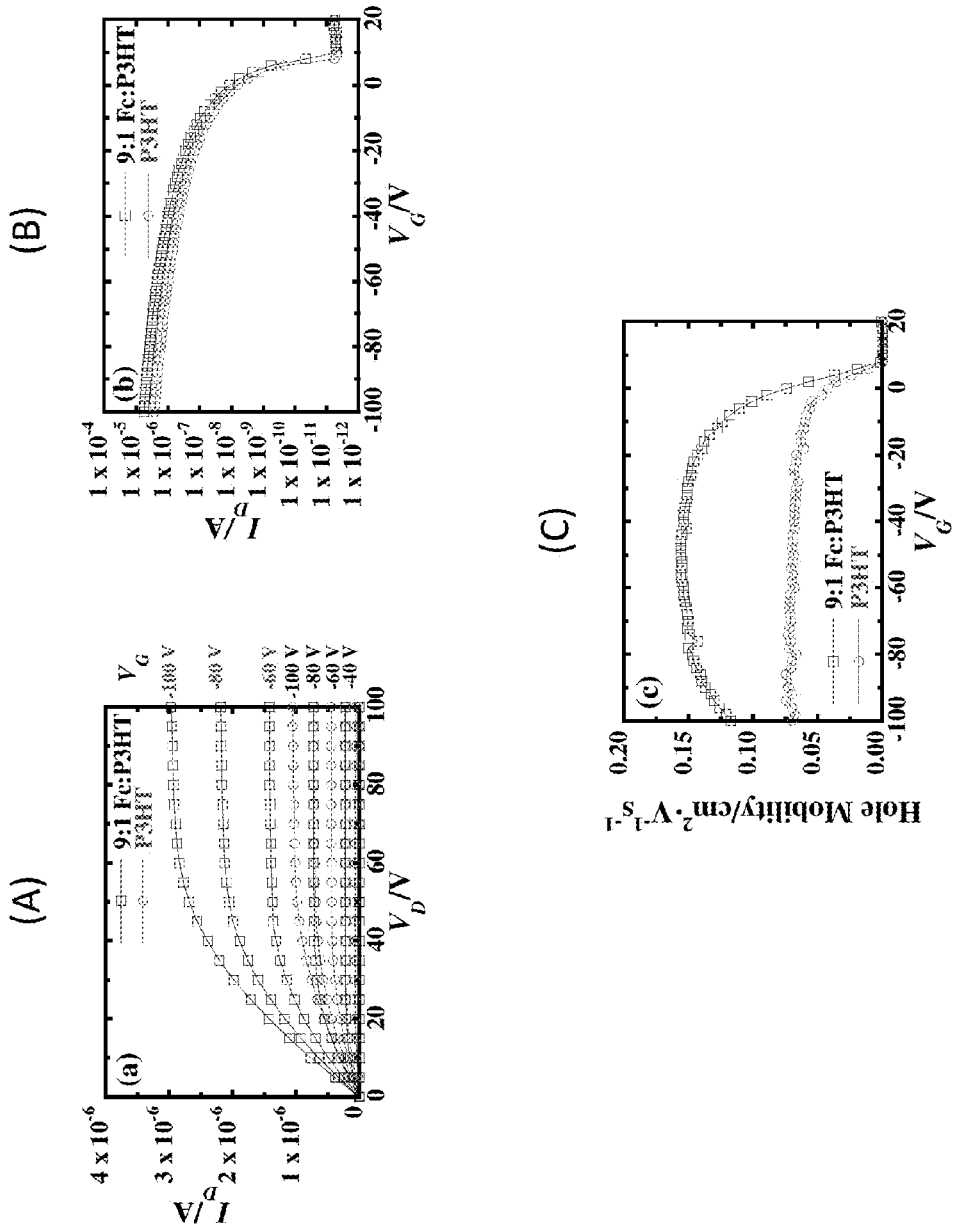
FIG. 1 (a) is a graph showing output characteristics for representative organic thin film transistors prepared from neat poly(3-hexylthiophene) and 9:1 ferrocene and poly(3-hexylthiophene) solutions by weight.

(b) 3:1 ferrocene:poly(3-hexylthiophene) solutions and (c) profiles of the region of interest for films spun cast from P3HT/ferrocene solutions.

DETAILED DESCRIPTION

The term "and/or" is used herein to mean both "and" as well as "or". For example, "A and/or B" is construed to mean A, B or A and B.

The transition term "comprising" is inclusive of the transition terms "consisting essentially of" and "consisting of" and can be interchanged for "comprising".

Disclosed herein are electrically conducting or semiconducting polythiophene compositions (hereinafter electrically conducting compositions) that comprise regioregular polythiophenes and metallocenes. The metallocenes are present in the electrically conducting compositions in amounts greater than 50 weight percent, based on the total weight of the electrically conducting composition. In an exemplary embodiment, the metallocenes are present in amounts of greater than 70 weight percent, based on the total weight of the electrically conducting composition.

When metallocenes are present in amounts of greater than 75 wt %, a novel crystal structure is formed in thin spin coated films. The new P3HT (poly3-hexylthiopene)polymorph exhibits better molecular orbital overlap and organic thin film transistor (OTFT) performance than previously known Form I and II structures produced by shorter π-stacking distances. The polymer unit cell is increasingly constricted in the π-stacking direction with increasing ferrocene solution concentration. At weight ratios of greater than 3:1 Fc:P3HT (ferrocene(Fc):poly3-hexylthiophene (P3HT)), the resulting charge mobility increases by roughly a factor of 3 over compositions having 50 wt % of ferrocene or less. As a result, polymer/ferrocene solutions can be effectively applied to generate high mobility, solution-processed active layers for use within organic thin film transistor.

In short, electron mobility performance can be enhanced by controlling the polymorphism of the polythiophene. The formation of a tighter π-π stacking crystal structure from P3HT/Fc solutions and the removal of ferrocene upon spin coating are useful factors leading to higher charge mobility.

In one embodiment, the electrically conducting composition may also include a solvent. In one embodiment, the polythiophenes comprise regioregular poly(alkylthiophenes) (PAT), regioregular poly[2,5-bis(3-alkylthiophen-2-yl)thieno(3,2-b)thiophene] (PBTTT), or combinations comprising at least one of the foregoing polythiophenes. Metallocenes may be straight or bent metallocenes. Exemplary metallocenes are ferrocenes, titanocenes, vanadocenes, manganocenes, cobaltocenes, or the like, or a combination comprising at least one of the foregoing metallocenes.

In an exemplary embodiment, the regioregular poly(alkylthiophenes) comprises regioregular poly(3-hexylthiophenes) (P3HT) while the regioregular poly[2,5-bis(3-alkylthiophen-2-yl)thieno(3,2-b)thiophene] comprises poly[2,5-bis(3-hexadecylthiophen-2-yl)thieno(3,2-b)thiophene]. An exemplary metallocene is ferrocene.

Disclosed herein too, is a method for increasing the charge mobility of electrically conducting compositions that comprise regioregular polythiophenes. In an exemplary embodiment, the method comprises mixing a solution that comprises a solvent, regioregular polythiophene and metallocene. As noted above, the metallocene is present in the electrically conducting composition in an amount of greater than 50 wt %, based on the total weight of the composition. In an exemplary embodiment, the metallocene may be present in the electrically conducting composition in an amount of greater than 75 wt %, based on the total weight of the composition. The solution may be optionally purified to remove aggregates or insoluble material. The resulting solution is then disposed upon a substrate and the solvent is evaporated leaving behind a film that comprises the regioregular polythiophene and the metallocene. Without being limited to theory, the large amount of metallocene present in the electrically conducting composition, promotes phase segregation of the regioregular polythiophene. The phase segregated regioregular polythiophene is purer than regioregular polythiophene that is not blended with the metallocene in amounts of greater than 50 wt % and as a result produces a greater charge mobility.

Regioregular polymers are those in which each repeat unit is derived from the same isomer of the monomer. In an exemplary embodiment, the regioregular polythiophenes are derived from the polymerization of 3-substituted thiophenes or alternatively by substituting the polythiophene in the 3-position. The asymmetry of 3-substituted thiophenes results in three possible couplings when two monomers are linked between the 2- and the 5-positions. They are 2,5' or head-tail (HT) coupling, 2,2' or head-head (HH) coupling or 5,5' or tail-tail (TT) coupling. The three couplings result in 4 distinct triads as shown in the formulas (I) through (IV) below.

Structure (I) below has HT-HT couplings

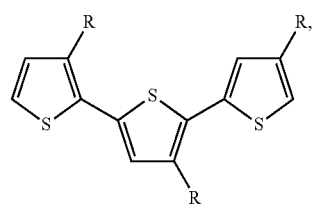

(I)

structure (II) below has HH-TH couplings

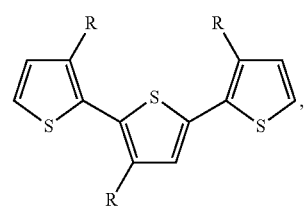

(II)

structure (III) below has HH-TT couplings

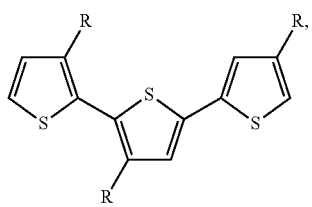

(III)

and structure (IV) has TT-HT couplings

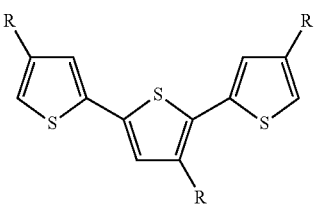

(IV)

where R is an alkyl group having 2 to 10 carbon atoms, an alkylenealkoxy group having 2 to 10 carbon atoms, a polyalkylene oxide group, an alkoxy group having 1 to 10 carbon atoms or an aralkyl group having 7 to 10 carbon atoms. Suitable polyalkylene oxide groups are those of the formula —($R^3O$)$_p$—, where $R^3$ is a ($C_2$-$C_6$)alkyl group and p is 1 to 1000, preferably 1 to 500. Exemplary polyalkylene oxide groups include polyethylene oxide groups, polypropylene oxide groups, polybutylene oxide groups, or mixtures thereof.

In one embodiment, a regioregular polythiophene can have all HH structures, all TT structures, all HT or all TH structures. When the HH or TT structures are combined with HT or TH structures as shown in the polythiophene, it is desirable to have at least a first block comprising one of the HH, TT, HT or TH structures copolymerized with a second block of comprising one of the HH, TT, HT or TH structures, where at least one of the blocks has at least 5 or more repeat units and where the structures included in the first block not identical with the structures included in the second block.

In one embodiment, the regioregular polythiophenes are polyalkylthiophenes that have the structure of formula (V):

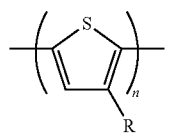

(V)

where R is an alkyl group having 2 to 10 carbon atoms, an alkylenealkoxy group having 2 to 10 carbon atoms, a polyalkylene oxide group, an alkoxy group having 1 to 10 carbon atoms or an aralkyl group having 7 to 10 carbon atoms. Suitable polyalkylene oxide groups are those of the formula —($R^3O$)$_p$—, where $R^3$ is a ($C_2$-$C_6$)alkyl group and p is 1 to 10, preferably 1 to 50. Exemplary polyalkylene oxide groups include polyethylene oxide groups, polypropylene oxide groups, polybutylene oxide groups, or mixtures thereof. In one exemplary embodiment, R is an alkyl group having 2 to 15 carbon atoms, preferably 3 to 10 carbon atoms. In another exemplary embodiment, R is a hexyl group and the regioregular polyalkylthiophene is poly(3-hexylthiophene). In an embodiment, n is 2 to 10000, specifically 3 to 5000.

In one embodiment, the regioregular polythiophenes may be block copolymers of polyalkylthiophenes that have the structures of formula (VI):

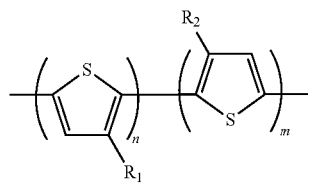

(VI)

where $R_1$ and $R_2$ can be the same or different and are independently a hydrogen, an alkyl group having 2 to 10 carbon atoms, an alkylenealkoxy group having 2 to 10 carbon atoms, a polyalkylene oxide group, an alkoxy group having 1 to 10 carbon atoms or an aralkyl group having 7 to 10 carbon atoms. Suitable polyalkylene oxide groups are those of the formula —($R^3O$)$_p$—, where $R^3$ is a ($C_2$-$C_6$)alkyl group and p is 1 to 10, preferably 1 to 5. Exemplary polyalkylene oxide groups include polyethylene oxide groups, polypropylene oxide groups, polybutylene oxide groups, or mixtures thereof. In the formula (VI), n is 2 to 10000 and m is 2 to 10000. The ratio of n to m can vary from 1:500 to 500:1. The block copolymer of formula (VI) can be a diblock, triblock or an alternating block copolymer. In one exemplary embodiment, $R_1$ and $R_2$ are hexyl groups. In another exemplary embodiment, $R_1$ is a hexyl group while $R_2$ is hydrogen.

In yet another embodiment, the regioregular polythiophenes may be alternating copolymers of polyalkylthiophenes that have the structures of formula (VII):

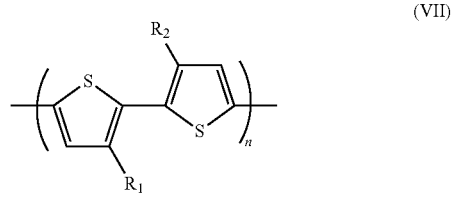

(VII)

where $R_1$ and $R_2$ can be the same or different and are independently a hydrogen, an alkyl group having 2 to 10 carbon atoms, an alkylenealkoxy group having 2 to 10 carbon atoms, a polyalkylene oxide group, an alkoxy group having 1 to 10 carbon atoms or an aralkyl group having 7 to 10 carbon atoms. Suitable polyalkylene oxide groups are those of the formula —($R^3O$)$_p$—, where $R^3$ is a ($C_2$-$C_6$)alkyl group and p is 1 to 1000, preferably 1 to 500. Exemplary polyalkylene oxide groups include polyethylene oxide groups, polypropylene oxide groups, polybutylene oxide groups, or mixtures thereof. In the formula (VII), n is 2 to 10000, specifically 3 to 5000. In one exemplary embodiment, $R_1$ and $R_2$ are hexyl groups. In another exemplary embodiment, $R_1$ is a hexyl group while $R_2$ is hydrogen.

In another embodiment, the electrically conducting or semiconducting polymeric compositions comprise regioregular poly[2,5-bis(3-alkylthiophen-2-yl)thieno(3,2-b)thiophene] having the structure of formula (VIII)

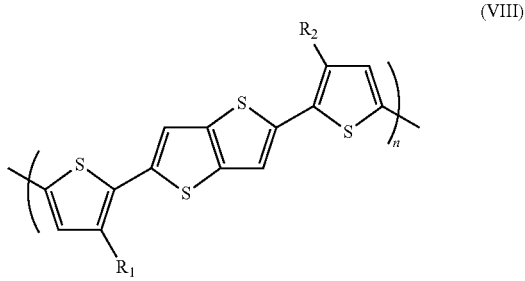

(VIII)

where $R_1$ and $R_2$ can be the same or different and are independently a hydrogen, an alkyl group having 2 to 10 carbon atoms, an alkylenealkoxy group having 2 to 10 carbon atoms, a polyalkylene oxide group, an alkoxy group having 1 to 10 carbon atoms or an aralkyl group having 7 to 10 carbon atoms. Suitable polyalkylene oxide groups are those of the formula —($R^3O$)$_p$—, where $R^3$ is a ($C_2$-$C_6$)alkyl group and p is 1 to 1000, preferably 1 to 500. Exemplary polyalkylene oxide groups include polyethylene oxide groups, polypropylene oxide groups, polybutylene oxide groups, or mixtures thereof. In the formula (VIII), n is 2 to 10000, specifically 3 to 5000. In one exemplary embodiment, $R_1$ and $R_2$ are hexyldecyl groups. In another exemplary embodiment, $R_1$ is a hexadecyl group or a hexyldecyl group while $R_2$ is hydrogen.

It is desirable for the regioregular polythiophene or the regioregular poly[2,5-bis(3-alkylthiophen-2-yl)thieno(3,2-b)thiophene] to have a number average molecular weight of 10,000 to 100,000 grams per mole, preferably 50,000 to 95,000 grams per mole, and more preferably 70,000 to 90,000 grams per mole.

The metallocenes used in the electrically conducting compositions have the structure of formula (IX)

(IX)

where M is Fe, Co, V, Ti, Li, Na, K, Mg, Mn, or the like. As can be seen in the structure (IX), a metallocene is a compound typically consisting of two cyclopentadienyl anions (Cp, which is $C_5H_5-$) bound to a metal center (M) in the oxidation state II, with the resulting general formula $(C_5H_5)_2M$. Closely related to the metallocenes are the metallocene derivatives, e.g., titanocene dichloride, vanadocene dichloride, and the like. An exemplary metallocene is ferrocene.

The metallocene is used in amounts of greater than 50 wt %, based on a total weight of the electrically conducting composition. In an exemplary embodiment, the metallocene is used in amounts of 75 to 98 wt %, preferably 80 to 95 wt %, and more preferably 85 to 93 wt %, based on the total weight of the electrically conducting composition. The regioregular polythiophenes are used in amounts of 5 to 25 wt %, specifically 10 to 20 wt %, based on the total weight of the electrically conducting composition.

In one embodiment, in one method of manufacturing the highly crystalline electrically conducting or semiconducting polymeric compositions, the regioregular polythiophene and/or the regioregular poly[2,5-bis(3-alkylthiophen-2-yl)thieno (3,2-b)thiophene] is first dissolved in a solvent at an appropriate temperatures. It is desirable for the solvents to not contain any water, i.e., for the solvent to be anhydrous.

Suitable solvents for solubilizing the regioregular polythiophene and/or the regioregular poly[2,5-bis(3-alkylthiophen-2-yl)thieno(3,2-b)thiophene] are aromatic or aliphatic hydrocarbons; aliphatic carboxylic esters; chlorohydrocarbons, aliphatic or araliphatic ethers, or a combination comprising at least one of the foregoing solvents. Examples of effective solvents are chlorobenzene, dicholorbenzene, trichlorobenzene, chloroform, toluene, xylene, tetrahydrofuran, dichloromethane, or the like, or a combination comprising at least one of the foregoing solvents. An exemplary solvent is trichlorobenzene.

The weight percent of the regioregular polythiophene and/or the regioregular poly[2,5-bis(3-alkylthiophen-2-yl)thieno (3,2-b)thiophene] in the solvent is 0.1 to 10 wt %, based on the total weight of the regioregular polythiophene and/or the regioregular poly[2,5-bis(3-alkylthiophen-2-yl)thieno(3,2-b)thiophene] and the solvent.

The mixture of the regioregular polythiophene and/or the regioregular poly[2,5-bis(3-alkylthiophen-2-yl)thieno(3,2-b)thiophene] and the solvent is stirred at room temperature for a period of 2 to 30 hours, preferably 4 to 30 hours, and more preferably 8 to 14 hours, followed by stirring at an elevated temperature of 60 to 100° C. for 1 to 120 minutes prior to casting.

The elevated temperature is generally below the vaporization temperature of the solvent and below the degradation temperature of the regioregular polythiophene and/or the regioregular poly[2,5-bis(3-alkylthiophen-2-yl)thieno(3,2-b)thiophene].

The regioregular polythiophene and/or the regioregular poly[2,5-bis(3-alkylthiophen-2-yl)thieno(3,2-b)thiophene] now dissolved in the solvent is then disposed on a substrate and the solvent is allowed to evaporate. The polymer may be disposed on the substrate by dip coating, spray coating, spin casting, curtain coating, doctor-blading, or a combination comprising at least one of the foregoing methods. In one embodiment, the regioregular polythiophene and/or the regioregular poly[2,5-bis(3-alkylthiophen-2-yl)thieno(3,2-b)thiophene] is disposed on a substrate by spin casting. The spin casting was conducted at a speed of 500 to 5,000 revolutions per minute, preferably 750 to 1,250 revolutions per minute for a time period of 30 seconds to 5 minutes, preferably 45 seconds to 90 seconds.

The substrate is a silicon substrate, a quartz substrate, a polymeric substrate, or the like. The substrate with the spun cast film was then heated (annealed) to a temperature of greater than 130° C., specifically greater than 140° C. and more specifically greater than or equal to 150° C. The upper limit of the temperature of annealing is 200° C.

Crystalline thin films manufactured from the regioregular polythiophene and/or the regioregular poly[2,5-bis(3-alkylthiophen-2-yl)thieno(3,2-b)thiophene] are used in article such as thin film transistors and field effect transistors. In one embodiment, these thin films can be disposed upon a substrate that contains a source and a drain electrode to form the thin film transistor. Thin film transistors manufactured by using the regioregular polythiophene and/or the regioregular poly[2,5-bis(3-alkylthiophen-2-yl)thieno(3,2-b)thiophene] may be used in display applications, solar cells, photovoltaic cells and the like.

The method of manufacturing the crystalline film is advantageous because it is inexpensive, produces a higher level of crystallinity than other known methods and may be used in low-power consumption electronic devices. This method of manufacturing the crystalline films produces crystalline levels that are least 50% greater, preferably at least 75% greater and more specifically at least 100% greater than other similar films that are manufactured by methods that do not involve mixing the regioregular polythiophene with metallocenes.

The invention is exemplified by the following non-limiting examples.

Example 1

This example was conducted to demonstrate that electrically conducting compositions prepared from solutions having 50 wt % or greater of the metallocene and regioregular polythiophenes display significantly improved charge mobility over comparative compositions prepared from solutions that do not contain the same amount of metallocene.

Sample bottom gate, bottom contact thin film transistors incorporating the novel polymer-metallocene blended semiconductor were prepared using a spin casting technique. 96.3% regioregular poly(3-hexylthiophene-2,5-diyl) (P3HT, commercially available as Lisicon SP001 from Merck) and ferrocene (Fc, 98% purity commercially available from Sigma Aldrich) were combined to achieve selected blend compositions while maintaining a fixed P3HT concentration of 10 mg/mL in an anhydrous trichlorobenzene (≥99% commercially available from Sigma Aldrich) solvent.

In addition to ferrocene, a substituted ferrocene-1,1'-Bis (di-tert-butylphosphino)ferrocene (BTBP Fc) shown below was used in conjunction with the P3HT.

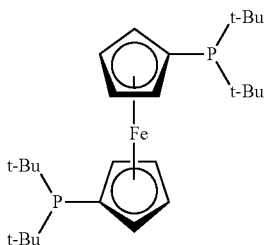

Each solution was stirred for approximately 14 hours at room temperature in a nitrogen purged glovebox. Prior to casting, the solution was heated at 90° C. for 1 minute, and 2500 μL of solution was immediately dispensed by pipette onto a trimethoxy(octadecyl)silane (90%, commercially available from Sigma Aldrich) surface-treated Si/SiO₂ substrate (Process Specialties, Inc.) with gold contact pads. The liquid was allowed to stand for 40 seconds to wet the surface before the spin casting commenced. Following the allotted wetting period, the sample was spun at 1000 RPM for 4 minutes. The as-cast sample was transferred to a hot plate for 3 hours of thermal annealing at 150° C., after which, the sample was rapidly cooled to room temperature and characterized with the aid of a probe station.

FIG. 1 depicts representative output (a), transfer (b), and hole mobility (c) curves for OTFT devices prepared from 100% P3HT and 90% ferrocene/P3HT solutions, respectively. Channel length and width dimensions are 320 and 220 μm, respectively. The source-drain bias is −100 V. From the FIGS. 6(a) and 6(b), it may be seen that the output and transfer values are significantly higher for compositions containing 90 wt % or greater of the ferrocene. From FIGS. 1(a) and 1(b), it may be seen that the source-drain currents are significantly higher for compositions containing 90 wt % or greater of the ferrocene with no deleterious effect on threshold voltage. From FIG. 1(c) it may be seen that the mobility of compositions containing amounts of 75 wt % or greater of ferrocene produce mobilities that are roughly 3 times that of neat poly(3-hexylthiophene)

Figure 2:
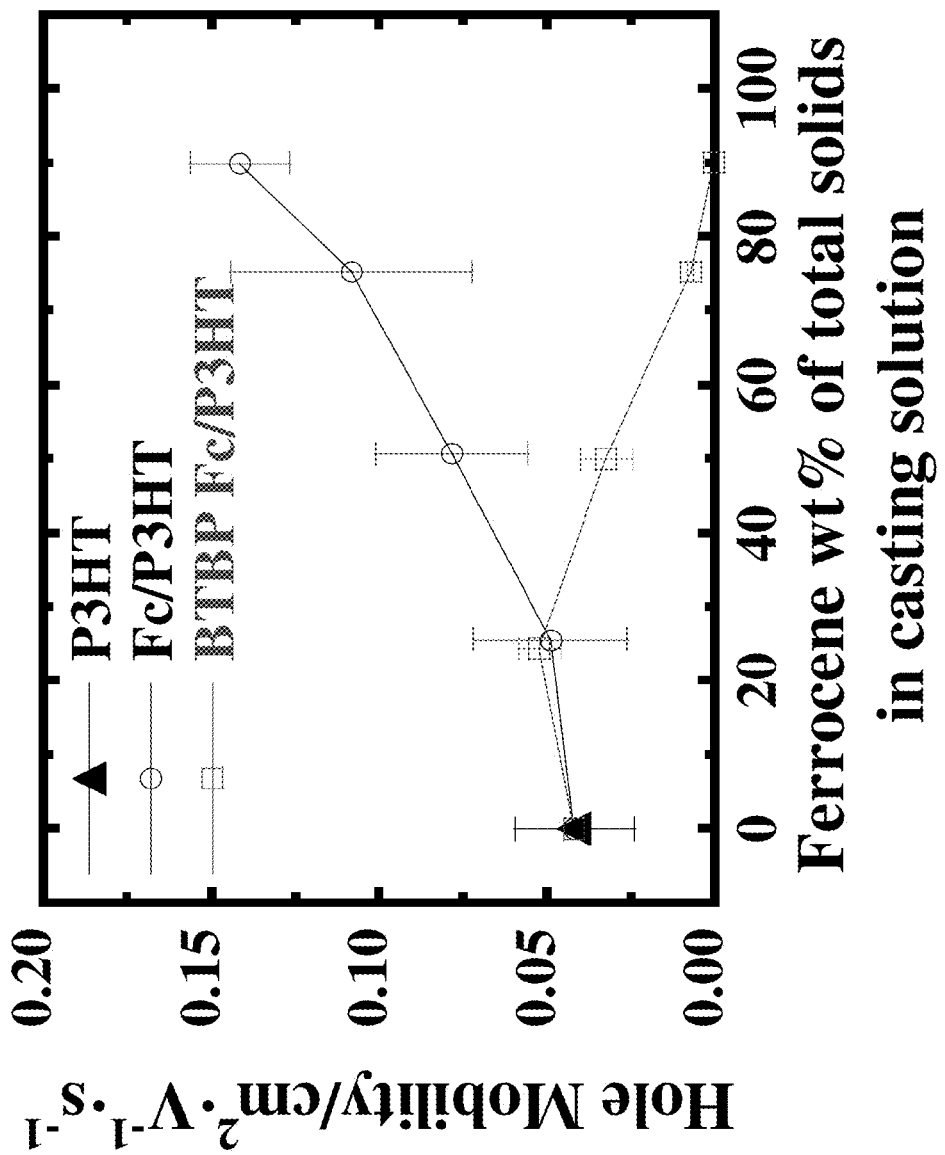
FIG. 2 is a graph showing average mobility of organic thin film transistors prepared from poly(3-hexylthiophene)/ferrocene solutions.

Average charge mobility values for each analyzed composition are summarized in FIG. 2. The amount of ferrocene is given as the weight percent of total solids in the casting solutions. Error bars indicate the standard deviation of multiple measurements averaged over five independent experiments and represent approximately 160 devices. From the FIG. 2, it may be seen that compositions containing ferrocene and poly(3-hexylthiophene) display increased hole mobility over compositions that contain only neat poly(3-hexylthiophene).

Figure 3:
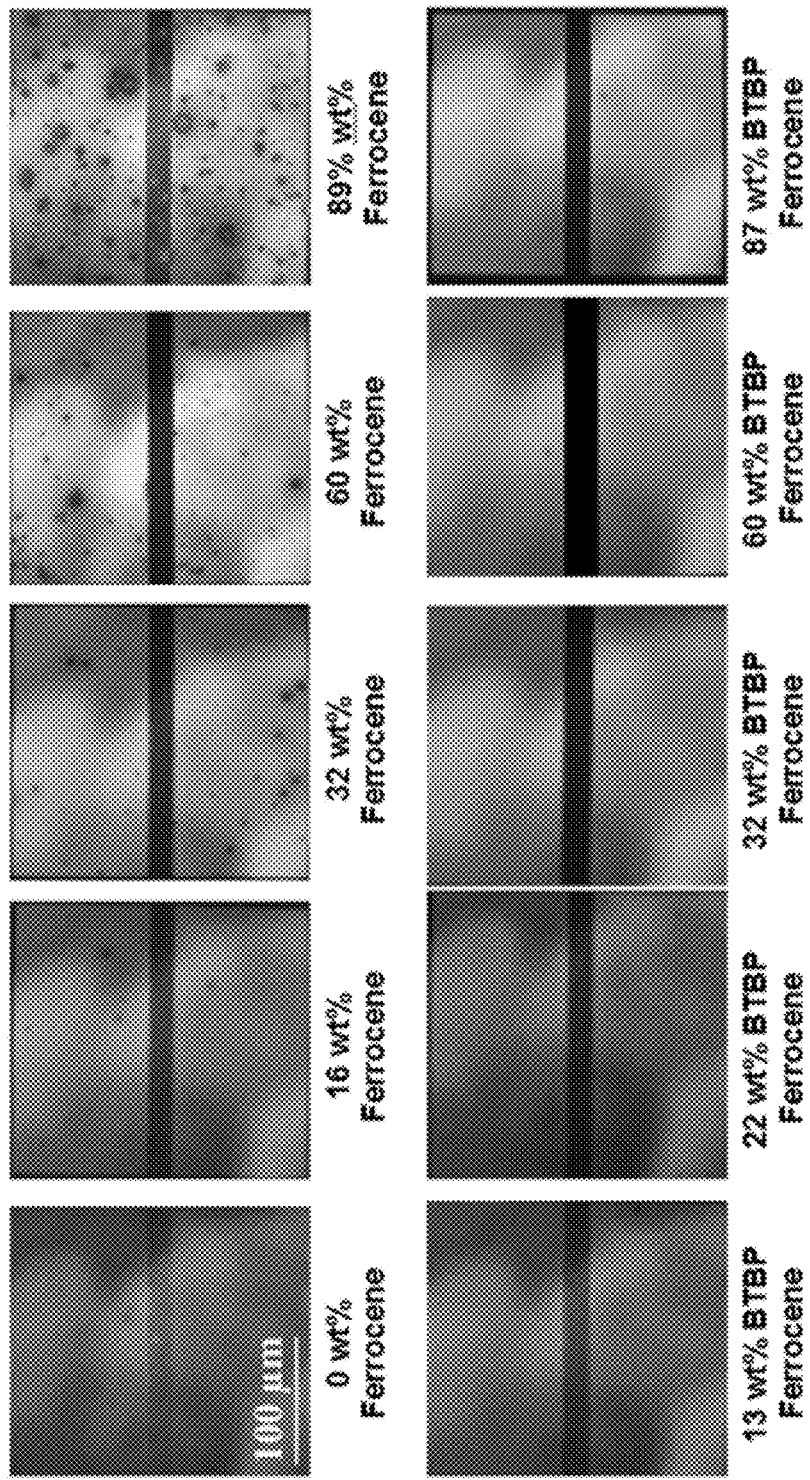
FIG. 3 shows light micrographs of films cast from P3HT/ferrocene solutions onto gold source and drain electrodes. Casting solution ferrocene contents, based on the total weight of dissolved solids, are displayed below the micrographs.

Images demonstrating representative films from each regioregular polythiophene (P3HT)/ferrocene composition are supplied in FIG. 3. From the FIGS. 2 and 3, it may be seen that the differing film morphology obtained when incorporating the ferrocene derivative 1,1'-bis(di-tert-butylphosphino) ferrocene (BTBP ferrocene) in place of ferrocene is correlated to the observed charge mobility decay with increasing BTBP ferrocene content.

Example 2

This example was conducted to detail and demonstrate the advantages of using metallocenes in an amount of greater than 50%, based on the total weight of the electrically conducting composition. In particular, this example along with Example 1 details advantages of the claimed composition over that of U.S. Patent Application 2009/0001359 A1 to Worle.

U.S. Patent Application 2009/0001359 A1 to Worle is directed to enhanced stability by adding metallocenes to polythiophene (PT). However, unsubstituted polythiophene is universally accepted as "insoluble and intractable." The standard polythiophene deposition approach requires an electrochemical process in which thiophene or bithiophene monomers are polymerized oxidatively at the anode. Research towards solution processing with polythiophene has resorted to extreme techniques, such as an AsF₃/AsF₅ solvent system or high temperature thermal cleaving of a soluble polythiophene derivate, but the resultant films cannot be re-dissolved following deposition.

Figure 4:
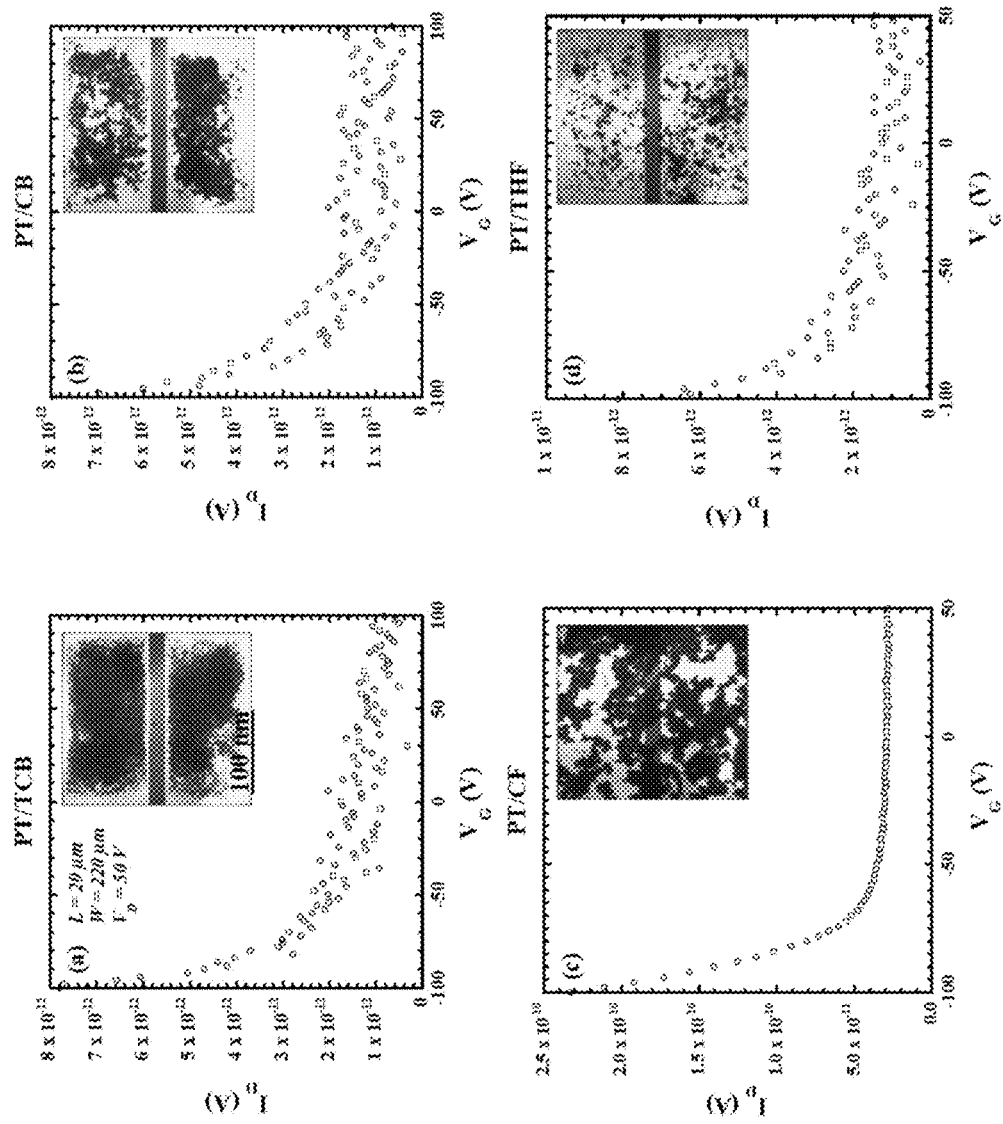
FIG. 4 contains graphs that show transfer curves and optical micrographs of transistors prepared from polythiophene in (a) 1,2,4-trichlorobenzene, (b) chlorobenzene, (c) chloroform, and (d) tetrahydrofuran.

In an effort to corroborate the methods outlined in U.S. Patent Application 2009/0001359 A1 to Worle, the polythiophene solutions detailed in Worle were reproduced and studied. Casting solutions were prepared from 5 mg bromine terminated poly(thiophene-2,5-diyl) and 0.5 mL solvent to achieve the desired concentration for the standard spin coating method. Several organic solvents were investigated, including tetrahydrofuran (THF), chloroform (CF), chlorobenzene (CB), and 1,2,4-trichlorobenzene (TCB). The casting solutions were vigorously stirred at 90° C. over the course of 3 days in a nitrogen purged glovebox. No solids were observed to settle out after settling for 6 hours, but the mixture remained dark and opaque, indicative of a fine suspension rather than complete dissolution of the polymer. The standard spin coating method was applied for each mixture to fabricate sample bottom-gate bottom-contact thin film transistors, and a 2 hour annealing step was completed at 150° C. An oxygen free atmosphere was maintained throughout the entire transistor preparation and characterization process. The performance observed for devices produced from each suspension was poor and significant aggregation was visible, as shown in FIG. 4. The data shown in FIG. 4 shows no discernible thin film transition performance.

In substituted polythiophenes, charge mobilities on the order of $10^{-3}$-$10^{-2}$ cm²/V·s are routinely observed. A baseline threshold mobility of $10^{-3}$ cm²/V·s is, therefore desirable before any mobility improvement can be identified. It has been observed that with the addition of metallocenes (e.g., ferrocenes in amounts of greater than 50 wt %) to polythiophenes charge mobilities on the order of $10^{-2}$-$10^{-1}$ cm2/V·s can be attained.

Figure 5:
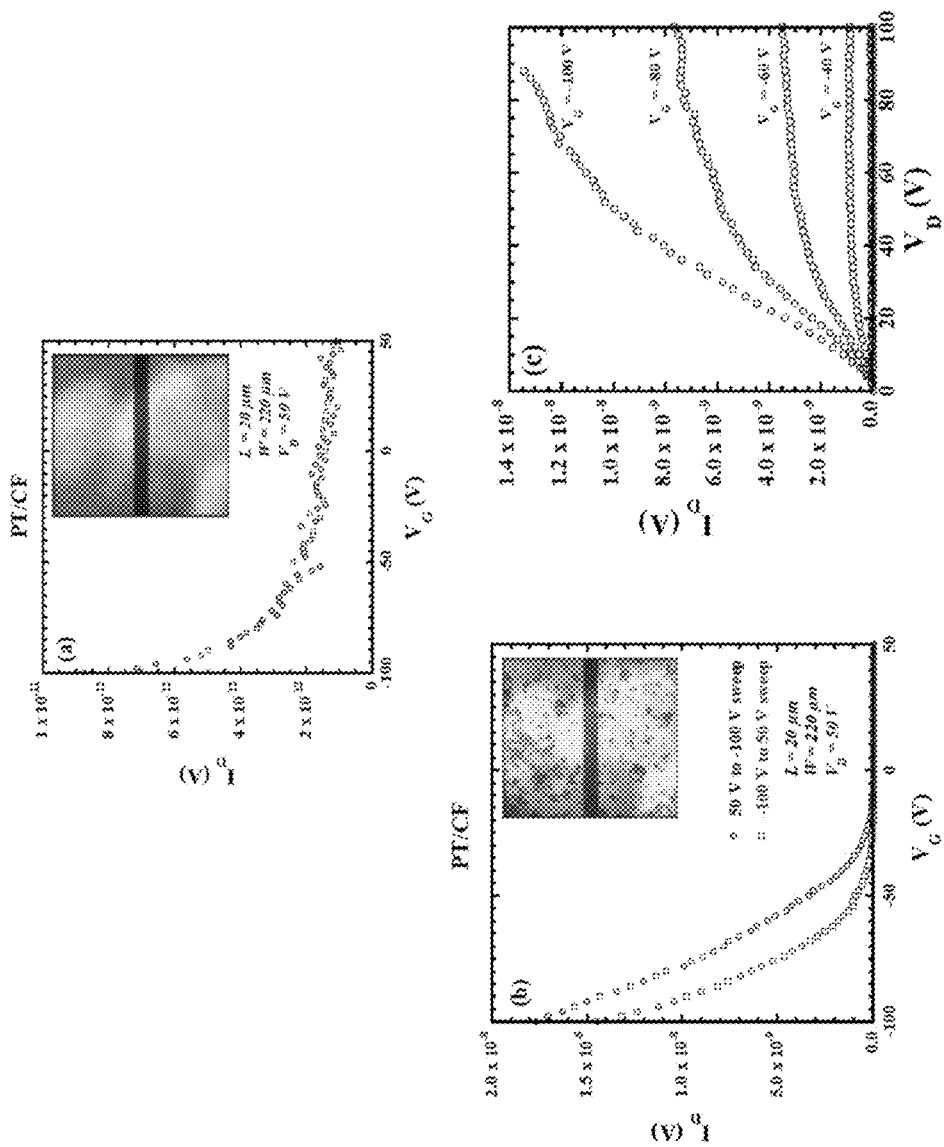
FIG. 5 contains graphs that detail characteristic curves and optical micrographs of transistors prepared from a filtered polythiophene/chloroform solution via (a) spin coating and (b)-(c) drop casting. The mobility for the device shown in (b) and (c) is $4.9 \times 10^{-5}$ cm$^2$N·s.

Despite the fact that none of the initial unsubstituted polythiophene samples met the charge mobility performance metrics of 10-3 cm²/V·s, additional optimization was performed beyond standard protocols in a further effort to validate the results obtained by Worle. Since the devices prepared from the polythiophene/chloroform solution displayed the greatest aptitude for utility as field-effect transistors, supplementary experimentation was pursued for this polymer-solvent system. A polythiophene/chloroform casting mixture was prepared as described above, and the suspension was filtered with the aid of a 0.2 μm syringe filter. Filtration eliminated the largest aggregates, but approximately 70-90% of the solids were discarded as a result. The transparent solution was then spin coated over gold source and drain electrodes onto a Si/SiO₂ dielectric and annealed at 150° C. Performance of the spin coated devices was poor, exemplified by the lack of source-to-drain current (ID), as demonstrated in FIG. 5. Again, there is no discernible thin film transistor performance.

Another attempt to obtain working devices from the filtered solution involved a drop casting technique. The polythiophene/chloroform solution was applied to a cleaned substrate, and sufficient time was allotted for the solvent to evaporate. Transfer and output characteristics of a device prepared from the drop casting method are given in FIG. 5. While field-effect was observed, the overall performance was extremely low and did not meet the mobility threshold of $10^{-3}$ cm2/Vs. The optical microscope images illustrated that agglomeration occurred leaving only a partial network for charge transport in the device channel.

In summary, US Patent Application 2009/0001359 A1 to Worle has focused on the stability enhancement with various additives to organic semiconductors, including metallocenes (ferrocene). US Patent Application 2009/0001359 A1 does not claim that ferrocene promotes phase separation, and the specified additive concentrations are less than 50% by weight, "and in particular preferably of 1 to 25% by weight." The disclosed invention on the other hand improves performance by increasing charge mobilities by using an amount of greater than 50 wt % of metallocenes, based on the total weight of the electrically conducting composition.

Example 3

This example was conducted to determine the effect of the addition of amounts of ferrocene greater than 75 wt % to the composition. The samples were prepared in the same manner as in example 1. Five compositions were tested using x-rays to investigate the crystallinity and crystal packing. These samples contained only poly(3-hexylthiophene) (i.e., neat poly(3-hexylthiophene)), and 4 compositions comprising ferrocene and poly(3-hexylthiophene) in weight ratios of 1:3, 1:1, 3:1, and 9:1.

Figure 6:
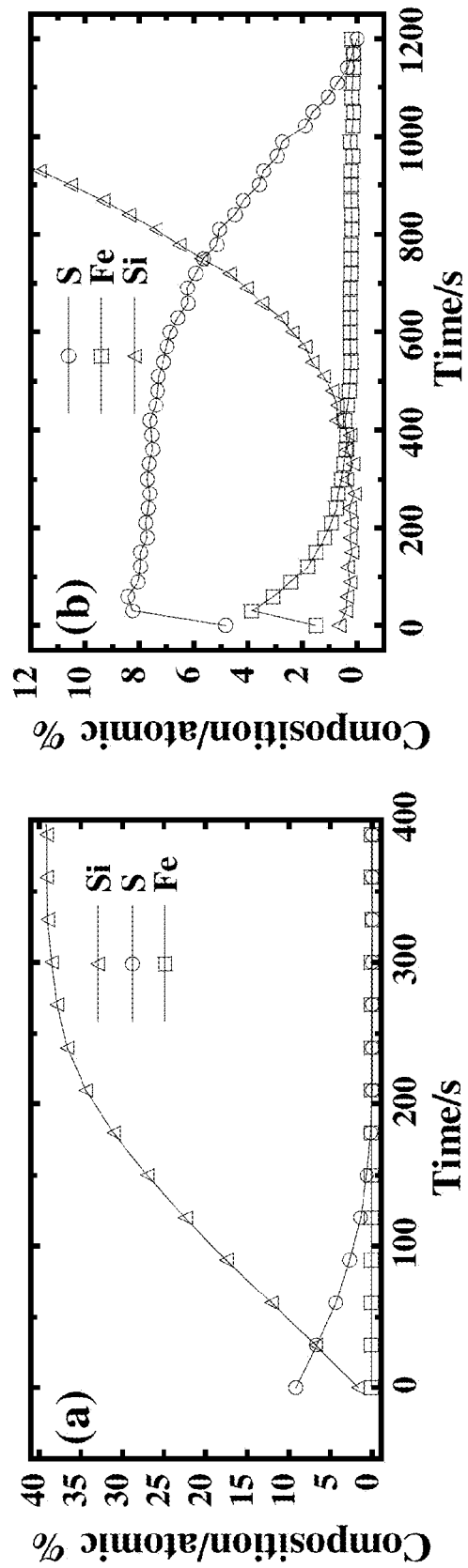
FIG. 6 is a graph showing a x-ray photoelectron spectroscopy depth profile for films (a) spun coated from a 6:4 Fc:P3HT (ferrocene:poly(3-hexylthiophene)) solution and annealed at 150° C. for 3 hours and (b) drop cast from a 9:1 Fc:P3HT solution and not annealed.

X-ray photoelectron spectroscopy was also conducted on the thin film transistors. FIG. 6 is a graph showing a x-ray photoelectron spectroscopy depth profile for films (a) spun coated from a 6:4 Fc:P3HT (ferrocene:poly(3-hexylthiophene)) solution and annealed at 150° C. for 3 hours and (b) drop cast from a 9:1 Fc:P3HT solution and not annealed. The removal of ferrocene upon spin coating proved to be an important factor for enhanced mobility, as demonstrated by XPS depth profiles in FIG. 6. The depth profile indicates that most of the ferrocene was not deposited with the polymer for spin coated transistors which evidenced the performance improvement. In contrast, ferrocene was detected in devices which were drop cast from similar solutions, but the charge mobility decreased slightly. Spin coating therefore facilitates a greater removal of the ferrocene and the resulting composition is seen to produce transistors with greater electron mobility. The resulting spin coated films consists of less than 1% ferrocene by weight, as demonstrated by FIG. 6.

Figure 7:
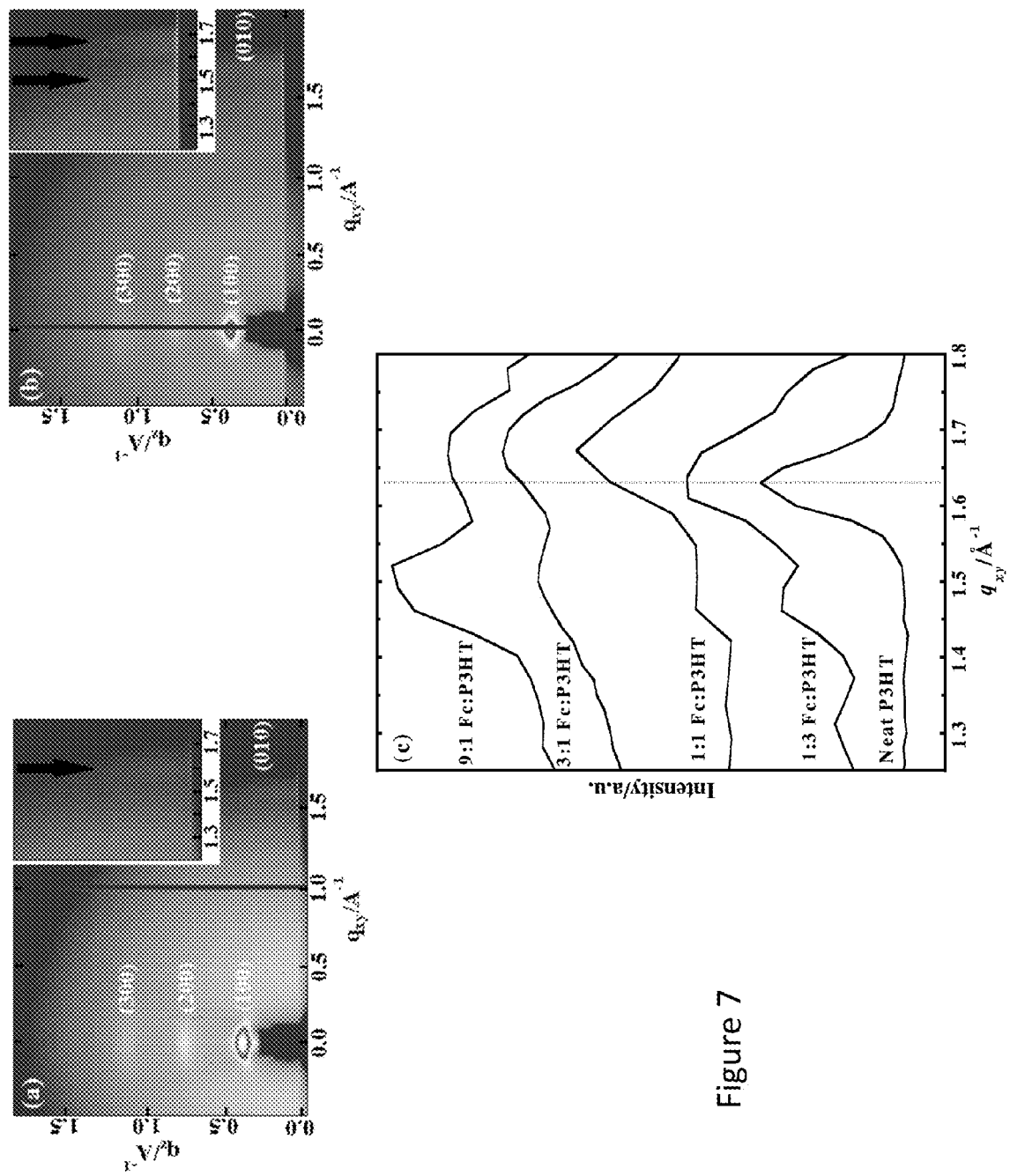
FIG. 7 depicts 2-D grazing-incidence x-ray diffraction images for films spun cast from (a) poly(3-hexylthiophene)

2-D grazing-incidence x-ray diffraction was also performed on spun cast films. FIG. 7 depicts 2-D grazing-incidence x-ray diffraction images for films spun cast from (a) poly(3-hexylthiophene) (b) 3:1 ferrocene:poly(3-hexylthiophene) solutions and (c) profiles of the region of interest for films spun cast from P3HT/ferrocene solutions. All films were annealed at 150° C. under an inert atmosphere. Insets provide a zoomed view of the (020) region of interest with arrows identifying peak locations.

What is claimed is:

1. A composition comprising:
    a regioregular polyalkylthiophene and/or a regioregular poly[2,5-bis(3-alkylthiophen-2-yl)thieno(3,2-b) thiophene]; and
    a metallocene; where the metallocene is present in an amount of greater than 75 wt %, based on the total weight of the composition; where the charge mobility is increased by a factor of 3 or more over compositions having 50 wt % of ferrocene or less with the remainder being a regioregular polyalkylthiophene and/or a regioregular poly[2,5-bis(3-alkylthiophen-2-yl)thieno(3,2-b) thiophene].

2. The composition of claim 1, where the metallocene has the structure of formula (IX)

where M is Fe, Co, V, Ti, Li, Na, K, Mg, or Mn.

3. The composition of claim 1, where the metallocene is present in an amount of 80 to 98 wt %, based on the total weight of the composition.

4. The composition of claim 1, where the regioregular polyalkylthiophenes have the structure of formula (V):

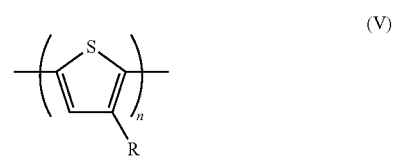

where R is an alkyl group having 2 to 20 carbon atoms, an alkylenealkoxy group having 2 to 20 carbons, a polyalkylene oxide group of the formula —$(R^3O)_p$—, where $R^3$ is a ($C_2$-$C_6$)alkyl group and p is 1 to 100, an alkoxy group having 1 to 20 carbon atoms or an aralkyl group having 7 to 20 carbon atoms, and where n is 5 to 10,000.

5. The composition of claim 4, where the regioregular polyalkylthiophene is poly(3-hexylthiophene).

6. The composition of claim 1, where the regioregular polyalkylthiophenes have the structures of formula (VI):

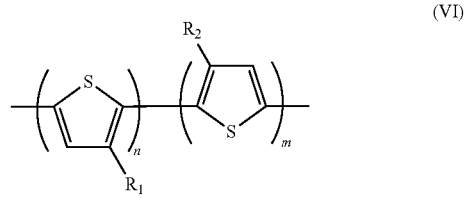

where $R_1$ and $R_2$ can be the same or different and are independently hydrogen, an alkyl group having 2 to 20 carbon atoms, an alkylenealkoxy group having 2 to 20 carbons, a polyalkylene oxide group of the formula —$(R^3O)_p$—, where $R^3$ is a ($C_2$-$C_6$)alkyl group and p is 1 to 100, an alkoxy group having 1 to 20 carbon atoms or an aralkyl group having 7 to 20 carbon atoms, and where n is 5 to 1000 and m is 5 to 1000 and where the ratio of n to m can vary from 100:1 to 5:1 and from 1:5 to 1:100, wherein at least one of $R_1$ and $R_2$ is not hydrogen.

7. The composition of claim 6, where $R_1$ and $R_2$ are hexyl groups or where $R_1$ is a hexyl group while $R_2$ is hydrogen.

8. The composition of claim 1, where the regioregular polyalkylthiophenes are alternating copolymers of polyalkylthiophenes that have the structure of formula (VII):

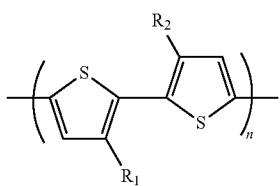

(VII)

where $R_1$ and $R_2$ can be the same or different and are independently hydrogen, an alkyl group having 2 to 20 carbon atoms, an alkylenealkoxy group having 2 to 20 carbons, a polyalkylene oxide group of the formula —$(R^3O)_p$—, where $R^3$ is a ($C_2$-$C_6$)alkyl group and p is 1 to 100, an alkoxy group having 1 to 20 carbon atoms or an aralkyl group having 7 to 20 carbon atoms and where n is 5 to 10,000, wherein at least one of $R_1$ and $R_2$ is not hydrogen.

9. The composition of claim 8, where $R_1$ and $R_2$ are hexyl groups or where $R_1$ is a hexyl group while $R_2$ is hydrogen.

10. The composition of claim 1, where the regioregular poly[2,5-bis(3-alkylthiophen-2-yl)thieno(3,2-b)thiophene] has the structure of formula (VIII)

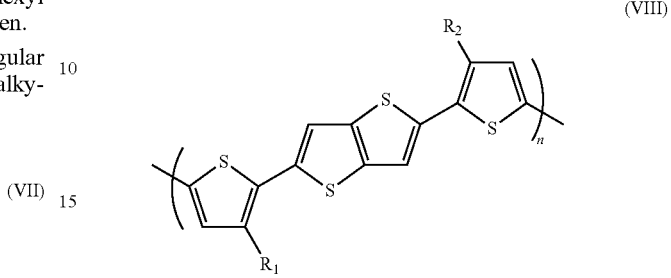

(VIII)

where $R_1$ and $R_2$ can be the same or different and are independently a hydrogen, an alkyl group having 2 to 20 carbon atoms, an alkylenealkoxy group having 2 to 20 carbons, a polyalkylene oxide group of the formula —$(R^3O)_p$—, where $R^3$ is a ($C_2$-$C_6$)alkyl group and p is 1 to 100, an alkoxy group having 1 to 20 carbon atoms or an aralkyl group having 7 to 20 carbon atoms, and where n is 5 to 10,000, wherein at least one of $R_1$ and $R_2$ is not hydrogen.

11. The composition of claim 10, where $R_1$ and $R_2$ are hexadecyl groups or hexyldecyl groups or where $R_1$ is a hexyldecyl group or a hexadecyl group while $R_2$ is hydrogen.

* * * * *